United States Patent
Azimi et al.

[19]

[11] Patent Number: 6,160,446
[45] Date of Patent: Dec. 12, 2000

[54] BALANCED DIFFERENTIAL AMPLIFIER WITHOUT COMMON-MODE FEEDBACK CIRCUIT

[75] Inventors: Kouros Azimi, West Chester; Dale Harvey Nelson, Shillington; Tseng-Nan Tsai, Allentown, all of Pa.

[73] Assignee: Lucent Technologies Inc., Murray Hill, N.J.

[21] Appl. No.: 09/092,404

[22] Filed: Jun. 5, 1998

[51] Int. Cl.[7] ........................................ H03F 3/45
[52] U.S. Cl. ........................ 330/69; 330/84; 330/258; 330/124 R
[58] Field of Search .................... 330/69, 84, 258, 330/252, 260, 124 R

[56] References Cited

U.S. PATENT DOCUMENTS

| | | | |
|---|---|---|---|
| 3,566,298 | 2/1971 | Stevens | 330/69 |
| 4,088,961 | 5/1978 | Ashley | 330/84 |
| 5,557,238 | 9/1996 | Weiss | 330/258 |
| 5,822,426 | 10/1998 | Rasmus et al. | 330/69 |

*Primary Examiner*—Michael B Shingleton
*Attorney, Agent, or Firm*—Duane, Morris & Heckscher LLP

[57] ABSTRACT

An integrated circuit comprising a balanced differential amplifier. The balanced differential amplifier has a first single-ended differential amplifier coupled at a first negative differential input terminal to a first input signal through a feedback network also coupled to an output terminal of the first amplifier. The first amplifier is also coupled at a first positive differential input terminal to a second input signal through a first resistor and to a reference voltage. The balanced differential amplifier also has a second single-ended differential amplifier coupled at a second negative differential input terminal to the second input signal through a second feedback network also coupled to an output terminal of the second amplifier. The second amplifier is also coupled at a second positive differential input terminal to the first input signal through a second resistor and to the reference voltage.

13 Claims, 1 Drawing Sheet

BALANCED DIFFERENTIAL AMPLIFIER WITHOUT COMMON-MODE FEEDBACK CIRCUIT

BACKGROUND OF THE INVENTION

1. Field of the Invention

The present invention relates to amplifiers and, in particular, to balanced differential amplifier circuits.

2. Description of the Related Art

The use of amplifiers is ubiquitous today. Typically a comparatively small voltage input signal, provided from a source such as a transducer, is provided to the input of an amplifier, which amplifies the input signal to provide a larger-amplitude output signal having the same waveform as that of the input signal, within a certain degree of accuracy. The output signal may be used, for example, for signal processing, or to drive recording equipment, an analog-to-digital converter, or an output device such as a loudspeaker.

One problem that plagues many conventional amplifiers is noise. Noise arises in a variety of ways. For example, in amplifiers implemented as part of an integrated circuit (IC) having a substrate, noise can arise from comparatively noisy sections of the substrate and thus adversely affect the amplifier portions of the IC. Pass-transistor switches turning off in switched-capacitor applications may also produce noise. Noise may be generated when unavoidable parasitics, associated with all silicon ICs, provide numerous paths for unwanted disturbances to couple into the signal path of an analog circuit via the substrate, the power supply rails, the ground lines, and/or even directly from nonideal components. Noise may accompany the input signal if the input lines delivering the input signal from the transducer pick up noise from some source external to the IC. Such noise may come, for example, from a noisy power supply that powers a transducer such as a microphone.

Noise may thus be introduced into the signal path of an amplifier, and be amplified along with the input signal, thus causing the amplified output signal to be a distorted representation of the input waveform. Such disturbances and distortions can accumulate, potentially leading to serious loss in signal-to-noise ratio and dynamic range.

Various types of amplifiers are in use. ICs typically implement amplifiers with one or more operational amplifiers ("op amps"). A conventional single-ended op amp, which has differential input and singled-ended output, may be especially prone to being adversely affected by such noise. Such an op amp has positive and negative differential inputs, and a single output terminal that provides an output voltage with respect to ground.

More complicated amplifier configurations, such as differential output op amp circuits or balanced differential output op amp circuits, are often utilized because of their superior noise resistance characteristics. For example, a differential op amp maintains positive and negative signal paths and provides two differential output terminals rather than having a single-ended output. This can help reduce the impact of noise, such as that produced by parasitic couplings or other sources. For example, if noise is injected into one signal path it is likely that the same or similar noise will be injected into the other signal path. Thus, since the output signal is seen as the difference between the two output terminals, the effect of the noise will be canceled out.

Further improvement is possible if such an analog op amp circuit is not only differential, but also balanced. A balanced differential op amp circuit is realized with dual inverting and noninverting signal paths, in a completely symmetrical layout, such that all parasitic injections couple equally into both signal paths as common-mode signals. The differential nature of these circuits causes these common-mode disturbances to cancel (or at least nearly cancel) such that their impact is reduced significantly. Single-ended, differential output, and balanced differential output op amp circuits are described in further detail in David A. Johns & Ken Martin, *Analog Integrated Circuit Design* (New York: John Wiley & Sons, Inc., 1997): pp. 280–282, and Kenneth R. Laker & Willy M. C. Sansen, *Design of Analog Integrated Circuits and Systems* (New York: McGraw-Hill, Inc., 1994): pp. 456–462, which are incorporated herein by reference.

Such balanced differential output op amps are more costly (e.g., in terms of IC "real estate" or design complexity) than single-ended op amps, however. For example, in one implementation (described with reference to FIGS. 5–41, page 458, of the Kenneth R. Laker & Willy M. C. Sansen text), two single-ended op amps are interconnected to implement a balanced differential output op amp. however, since the output of one of the single-ended op amps feeds the input of the second, there is increased processing delay as well as phase difference between the two output signals at high frequencies, since the input signals see different hardware (one sees one single-ended op amp and the other sees two).

Another problem that accompanies some differential output op amp designs is that a common-mode feedback (CMFB) circuit typically needs to be added, as described in the David A. Johns & Ken Martin text, pp. 280–282. The extra CMFB circuitry is used to establish the common-mode (i.e., average) output voltage. Ideally, it keeps this common-mode voltage immovable, preferably close to halfway between the power-supply voltages, even when large differential signals are present. Without it, the common-mode voltage is left to drift, since, although the op amp is placed in a feedback configuration, the common-mode loop gain is not typically large enough to control its value. Such is not the case with differential signals as the differential loop gain is typically quite large. However, the design of a good CMFB circuit is not trivial, and may introduce unwanted complexity and/or cost.

SUMMARY

In the present invention, an integrated circuit comprises a balanced differential amplifier. The balanced differential amplifier has a first single-ended differential amplifier coupled at a first negative differential input terminal to a first input signal through a feedback network also coupled to an output terminal of the first amplifier. The first amplifier is also coupled at a first positive differential input terminal to a second input signal through a first resistor and to a reference voltage. The balanced differential amplifier also has a second single-ended differential amplifier coupled at a second negative differential input terminal to the second input signal through a second feedback network also coupled to an output terminal of the second amplifier. The second amplifier is also coupled at a second positive differential input terminal to the first input signal through a second resistor and to the reference voltage.

DESCRIPTION OF THE PREFERRED EMBODIMENT

Figure 1:
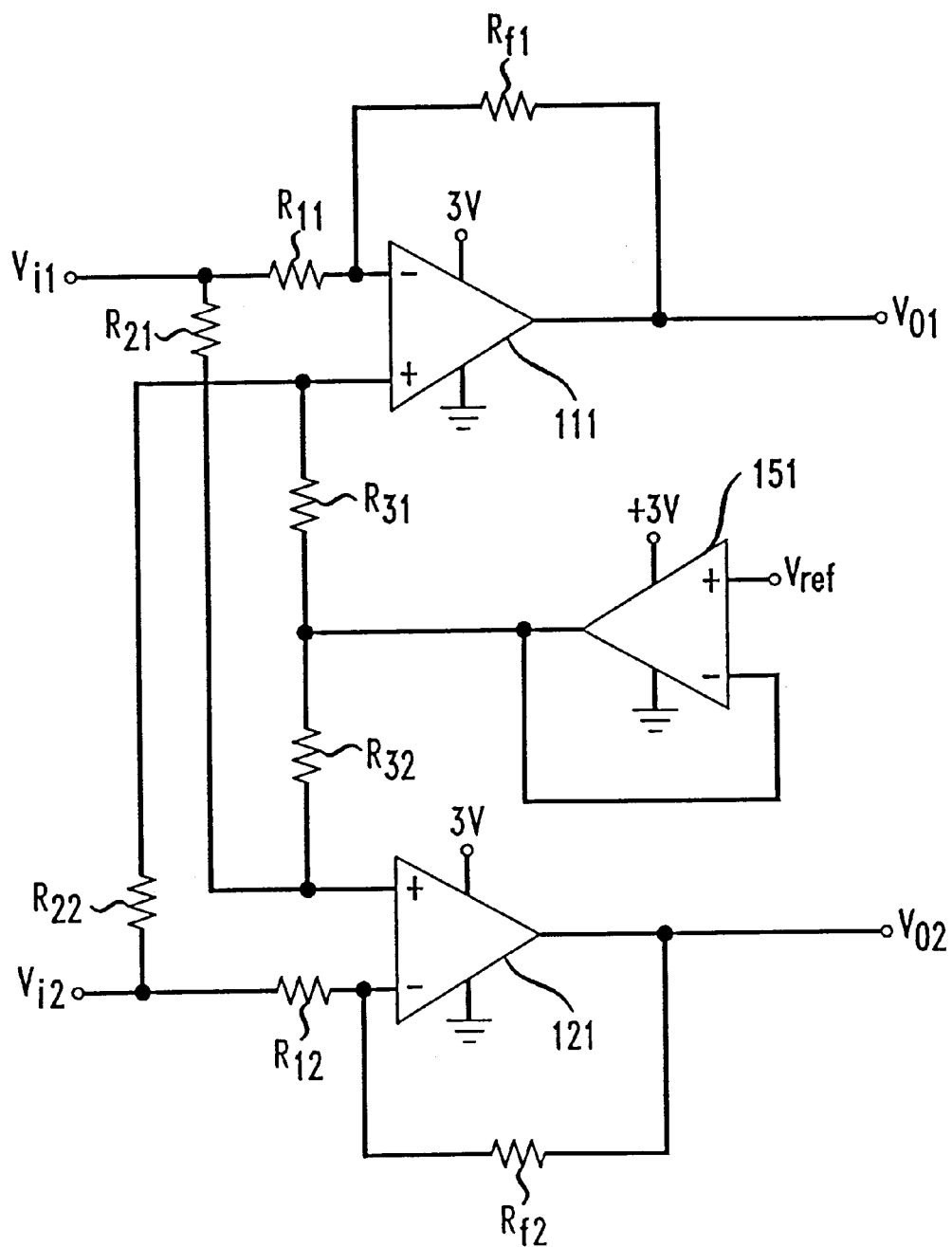
FIG. 1 is a circuit diagram of a balanced differential amplifier circuit, in accordance with an embodiment of the present invention.

Referring now to FIG. 1, there is illustrated a circuit diagram of a balanced differential amplifier circuit 100, in accordance with an embodiment of the present invention. Circuit 100 comprises op amps 111 and 121, as well as an op amp configured as a buffer 151. Circuit 100 also comprises resistors $R_{11}$, $R_{21}$, $R_{31}$, $R_{f1}$, $R_{12}$, $R_{22}$, $R_{32}$, and $R_{f2}$, intercoupled as illustrated. Circuit 100 receives differential input voltage signals $V_{i1}$ and $V_{i2}$, where an input signal $V_i = V_{i1} - V_{i2}$. Circuit 100 provides differential output voltage signals $V_{O1}$ and $V_{O2}$, where an output signal $V_O = V_{O1} - V_{O2}$. An input reference voltage $V_{REF}$ is provided to buffer 151. Each of the op amps is preferably powered by supply rails of +3V and ground. Circuit 100 is preferably implemented on an IC having a common substrate.

The value of symmetrical components are preferably identical, for example $R_{f1} = R_{f2}$, and so forth. The input signals $V_{i1}$ and $V_{i2}$ are typically on the order of mV; $V_{O1}$ and $V_{O2}$ have approximately a 2Vp-p signal swing, so that $V_O$ has a 4Vp-p signal swing.

As will be appreciated by those skilled in the art, the following equations represent the operation of circuit 100, where $R_{11} = R_{12} = R_1$; $R_{21} = R_{22} = R_2$; $R_{31} = R_{32} = R_3$; $R_{f1} = R_{f2} = R_f$:

$$V_{O1} = V_{i1}(-R_f/R_1) + V_{i2}(1+R_f/R_1)(R_3/(R_3+R_2)) + V_{REF}(1+R_f/R_1)(R_2/(R_2+R_3))$$

$$V_{O2} = V_{i2}(-R_f/R_1) + V_{i1}(1+R_f/R_1)(R_3/(R_3+R_2)) + V_{REF}(1+R_f/R_1)(R_2/(R_2+R_3))$$

$$V_O = V_{O1} - V_{O2} = (-R_f/R_1)(V_{i1} - V_{i2}) + (V_{i2} - V_{i1})(1+R_f/R_1)(R_3/(R_3+R_2))$$

$$= (V_{i1} - V_{i2})((-R_f/R_1) - (1+R_f/R_1)(R_3/(R_3+R_2)))$$

By choosing $R_3 = R_2$ and $R_f = R_1$, we have:

$$V_O = (V_{i1} - V_{i2})(-1 - (2)(\tfrac{1}{2}))$$

$$= -2(V_{i1} - V_{i2})$$

Thus, in circuit 100, op amp 111 is coupled at its negative input terminal to the output terminal and a first input signal $V_{i1}$ via a resistive feedback network ($R_{f1}$, $R_{11}$); and at its positive input terminal to reference voltage $V_{REF}$ and to a second input signal $V_{i2}$ via a second resistive network ($R_{31}$, $R_{22}$), where input signal $V_{i2}$ is further divided by the feedback network ($R_{12}$, $R_{f2}$) for the other op amp 121. Conversely, op amp 121 is symmetrically coupled at its negative input terminal to the output terminal and second input signal $V_{i2}$ via a resistive feedback network ($R_{f2}$, $R_{12}$); and at its positive input terminal to reference voltage $V_{REF}$ and to the first input signal $V_{i1}$ via a second resistive network ($R_{32}$, $R_{21}$), where input signal $V_{i1}$ is further divided by the feedback network ($R_{11}$, $R_{f1}$) for the other op amp 111.

As will be appreciated, the values of the resistors and other parameters of circuit 100 may be selected empirically. $V_{REF}$ is preferably 1V, or approximately half the 3V supply voltage. This reference may be selected to balance the signal swings of $V_{O1}$ and $V_{O2}$ so as to maximize the signal swing of $V_O$. The input $V_{REF}$ is preferably taken from a reference voltage internal to the IC, such as the bandgap reference circuit. This allows the need for an extra pin or voltage source to be avoided. Further, buffer 151 may be implemented as a conventional op amp, which has a much simpler design and implementation than CMFB circuits.

Thus, the present invention avoids the need for a CMFB circuit, while still providing a balanced, fully differential op amp. The present invention thus provides for an improved power supply rejection ratio as well as common-mode rejection ratio, and reduction of second harmonics caused by such noise. Further, the time delay seen by each input signal $V_{i1}$ and $V_{i2}$ is the same, since each passes simultaneously through two op amps 111, 121, rather than one of them passing in series through two single-ended op amps as in some prior art approaches.

It will be understood that various changes in the details, materials, and arrangements of the parts which have been described and illustrated above in order to explain the nature of this invention may be made by those skilled in the art without departing from the principle and scope of the invention as recited in the following claims.

What is claimed is:

1. An integrated circuit comprising:
   (a) a first single-ended differential amplifier coupled at a first negative differential input terminal to a first input signal through a feedback network also coupled to an output terminal of the first amplifier, the first amplifier also being coupled at a first positive differential input terminal to a second input signal through a first resistor and to a reference voltage; and
   (b) a second single-ended differential amplifier coupled at a second negative differential input terminal to the second input signal through a second feedback network also coupled to an output terminal of the second amplifier, the second amplifier also being coupled at a second positive differential input terminal to the first input signal through a second resistor and to the reference voltage.

2. The integrated circuit of claim 1, wherein the first amplifier is coupled at the first positive differential input terminal to the reference voltage through a third resistor and the second amplifier is coupled at the second positive differential input terminal to the reference voltage through a fourth resistor.

3. The integrated circuit of claim 1, further comprising a balanced differential amplifier comprising the first and second amplifiers.

4. The integrated circuit of claim 1, further comprising a unity gain buffer coupled at an input terminal to a reference voltage source and at an output terminal to the first positive differential input terminal through a third resistor and to the second positive differential input terminal through a fourth resistor.

5. The integrated circuit of claim 4, wherein:
   the first and second amplifiers are operational amplifiers;
   the first and second operational amplifiers are each coupled to supply rails of +3V and ground; and
   the reference voltage is approximately 1V.

6. The integrated circuit of claim 1, wherein the reference voltage is a ground.

7. The integrated circuit of claim 1, wherein the first and second amplifiers are operational amplifiers.

8. The integrated circuit of claim 7, wherein the first and second operational amplifiers are each coupled to supply rails of +3V and ground.

9. The integrated circuit of claim 1, wherein the difference between the first and second input signals corresponds to a differential input signal.

10. The integrated circuit of claim 1, wherein components coupled to the first amplifier have the same values as corresponding components symmetrically coupled to the second amplifier.

11. A circuit comprising:
   (a) a first single-ended differential amplifier coupled at a first negative differential input terminal to a first input signal through a feedback network also coupled to an output terminal of the first amplifier, the first amplifier also being coupled at a first positive differential input terminal to a second input signal through a first resistor and to a reference voltage; and (b) a second single-ended differential amplifier coupled at a second negative differential input terminal to the second input signal through a second feedback network also coupled to an output terminal of the second amplifier, the second amplifier also being coupled at a second positive differential input terminal to the first input signal through a second resistor and to the reference voltage.

12. The integrated circuit of claim 4, wherein:

the first and second amplifiers are operational amplifiers;

the first and second operational amplifiers are each coupled to a supply voltage and ground; and the reference voltage is approximately half the supply voltage.

13. The integrated circuit of claim 4, wherein:

the first and second amplifiers are operational amplifiers (op amps);

the first and second operational amplifiers are each coupled to a supply voltage and ground;

the difference between the first and second input signals corresponds to a differential input signal;

the difference between a first output signal on the output terminal of the first op amp and a second output signal on the output terminal of the second op amp corresponds to a differential output signal; and the reference voltage is selected so as to maximize the signal swing of the differential output signal.

* * * * *